United States Patent [19]

Friemert

[11] 4,408,624
[45] Oct. 11, 1983

[54] SYSTEM FOR ARRANGING FERROMAGNETIC COIL SPRINGS AND FEEDING SAME TO A WORK STATION

[75] Inventor: Horst Friemert, Erlangen, Fed. Rep. of Germany

[73] Assignee: Siemens Aktiengesellschaft, Munich, Fed. Rep. of Germany

[21] Appl. No.: 329,014

[22] Filed: Dec. 9, 1981

[30] Foreign Application Priority Data

Dec. 17, 1980 [DE] Fed. Rep. of Germany ....... 3047587

[51] Int. Cl.³ .............................................. B08B 3/04
[52] U.S. Cl. ...................................... 134/133; 134/1; 134/25.1; 134/140; 221/212; 221/224; 221/278
[58] Field of Search ..................... 134/1, 14, 25, 133, 134/140, 165; 221/212, 224, 278

[56] References Cited

U.S. PATENT DOCUMENTS 2,657,812 11/1953 Fox ............................... 221/278 UX
3,318,470 5/1967 Tatibana .......................... 134/133 X

FOREIGN PATENT DOCUMENTS 576559 4/1946 United Kingdom ................ 221/212

Primary Examiner—Robert L. Bleutge
Attorney, Agent, or Firm—Kenyon & Kenyon

[57] ABSTRACT

An arrangement for unscrambling ferromagnetic coil springs from a pile of coil springs, and conducting the coil springs to a work station. A cassette containing a disorganized pile of springs is provided with a first surface having openings, and discharge tubes associated therewith. A second surface which adjoins the first surface is provided with impact edges for controlling the upwardly vertical travel of the coil springs in response to a traveling electromagnetic field which, in one embodiment, is produced by a linear motor stator. The linear motor stator is arranged at an angle with respect to the second surface of the cassette, the apex of the acute angle being arranged at the junction between the first and second surfaces of the cassette. The traveling electromagnetic field attracts the springs to the second surface and causes them to travel upwardly until they encounter the impact edges. The inclination of the second surface with respect to the linear motor stator causes the springs to be conveyed into the discharge tubes.

5 Claims, 1 Drawing Figure

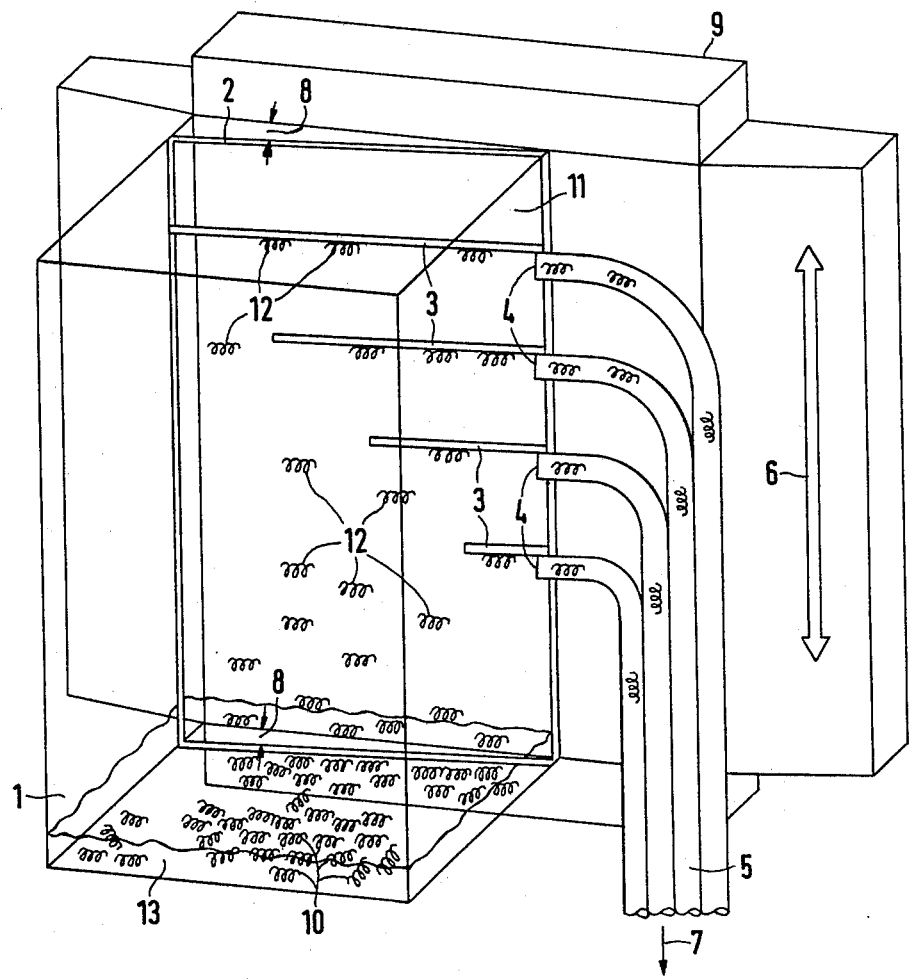

SYSTEM FOR ARRANGING FERROMAGNETIC COIL SPRINGS AND FEEDING SAME TO A WORK STATION

BACKGROUND OF THE INVENTION

This invention relates generally to systems for unscrambling ferromagnetic coil springs from a random pile, and more particularly, to a system which unscrambles the springs by means of a traveling electromagnetic field, and which supplies the springs to a work station.

Coil springs are generally provided in random disorder in a container. Upon being removed from the container, the springs are disposed on a random pile from which the springs must be removed and ordered prior to being fed to automatic processing machinery. One type of known arrangement organizes springs and distributes them to feed tubes by means of guiding grooves utilizes compressed air to remove the springs from the random pile in a chance process. The springs are transported in the guiding grooves by operation of compressed air or vibratory motion. Alternatively, the prior art unscrambles ferromagnetic coil springs by means of traveling electromagnetic fields which deposit the springs into horizontal magazines which are adapted to accommodate the springs.

It is, therefore, an object of this invention to provide a system for physically separating isolated coil springs from a random pile of springs, and which transport the springs to a processing station.

SUMMARY OF THE INVENTION

The foregoing and other objects are achieved by this invention which provides a rectangular cassette formed of a non-ferromagetic material, the cassette having on one lateral surface thereof a plurality of vertically arranged outlet openings which are disposed above one another, and at predetermined distances from one another. The interior of the cassette is further provided with impact edges at its rear wall and at the height of the outlet openings. Discharge tubes of non-ferromagnetic material are coupled to the cassette at the outlet openings for receiving the separated springs. The rear wall of the cassette is affixed to a vertically mounted linear motor stator so as to form an acute angle between the rear wall and the stator. The apex of the acute angle is located at the lateral surface having the discharge tubes.

In one embodiment, the angle between the rear wall of the cassette and the linear motor stator is between 5 and 10 degrees. In addition, the impact edges are raised from the rear wall by a distance corresponding to one-quarter of the coil spring diameter.

In a further embodiment, the discharge tubes are formed of a plastic material. Moreover, a washing or cleaning bath for the coil springs may be provided in the cassette.

BRIEF DESCRIPTION OF THE DRAWING

Comprehension of the invention is facilitated by reading the following detailed description in conjunction with the annexed drawing which is a schematic perspective representation of one embodiment of the invention.

DETAILED DESCRIPTION

The FIGURE shows a device constructed in accordance with the principles of the invention for unscrambling and transporting ferromagnetic coil springs in response to traveling electromagnetic field forces produced by a linear motor. Each of the coil springs, in the vicinity of the traveling electromagnetic field, rotates about its respective longitudinal axis, repels other springs, and is aligned in a predetermined orientation. Moreover, the ferromagnetic coil springs are attracted by the traveling electromagnetic field to produce a composite effect which results in the reliable unscrambling of the random pile. In response to the traveling electromagnetic field, the isolated ones of the coil springs roll upward along the linear motor stator against the force of gravity, if the traveling field is directed downward. This results from the self-rotation of the coil springs in the traveling electromagnetic field and by the friction caused by the force of attraction of the magnetic field on the coil springs. Entangled coil springs cannot roll up the rear wall of the cassette under the influence of the traveling electromagnetic field. Accordingly, the inventive arrangement provides the means by which the springs can be unambiguously separated, independent of chance.

As shown in the drawing, a plurality of coil springs 10 which are to be unscrambled are provided at the bottom of a cassette 1, which is formed of non-ferromagnetic material. Cassette 1 is fastened to a vertically mounted linear motor stator 9 so that between a rear wall 12 of the cassette, and the linear motor stator, an acute angle 8 of illustratively 5 degrees is formed. When stator 9 is energized to produce the traveling electromagnetic field, designated by arrow 6, loose ones of coil springs 10, and subsequently unscrambled ones of the coil springs, begin to roll up rear wall 2 of cassette 1 until they encounter one of the impact edges 3. The rolling springs remain at the impact edges rotating about their own axes, and travel in the direction of outlet openings 4. Such a travel of the rotating coil springs results from the angle of inclination 8 of rear wall 2 relative to stator 9. In this embodiment, outlet openings 4 are dimensioned so as to be just large enough that only perfect, not deformed springs can pass therethrough and into discharge tubes 5. Discharge tubes 5 are formed of a commercially available plastic material. The lengths of impact edges 3 are made so that the discharge tubes are uniformly filled.

Discharge tubes 5 are bent so that the springs travel downwardly from discharge openings 4, and in the vicinity of traveling electromagnetic field 6. As long as traveling field 6 is activated, the springs remain in the vicinity of stator 9 as a result of the magnetic attraction. Upon discontinuing power to the field, the springs accumulated in tubes 5 fall downwardly under the influence of gravity and can be fed to processing equipment in the direction of an arrow 7. In some embodiments, a washing or cleaning bath 13 may be provided in cassette 1.

Although the invention has been described in terms of a specific embodiment for a specific application, persons skilled in the art, in light of this teaching, can configure additional embodiments without departing from the spirit or exceeding the scope of the invention. Accordingly, it is to be understood that the drawing and descriptions in this disclosure are proffered to facilitate comprehension of the invention and should not be construed to limit the scope thereof.

What is claimed is:
1. An arrangement for unscrambling ferromagnetic coil springs from a random pile, the arrangement being of the type which utilizes a traveling electromagnetic field for unscrambling the coil springs and for feeding them to a work station, the arrangement comprising:

cassette means formed of non-ferromagnetic material in a rectangular configuration, said cassette means having a first interior vertical surface provided with outlet openings which are arranged vertically above one another, and at predetermined distances from one another, said cassette means further having a second interior surface having impact edges thereon, said impact edges being horizontally arranged at vertical heights corresponding to respectively associated ones of said outlet openings of said first interior surface, said impact edges being raised from said second interior surface by a predetermined impact edge height;

discharge tube means formed of a non-ferromagnetic material engaged with respectively associated ones of said outlet openings of said first interior surface; and linear motor stator means for producing the traveling electromagnetic field, said cassette means being vertically fastened to said linear motor stator means so as to produce an acute angle between said linear motor stator means and said second interior surface of said cassette means, said acute angle having an apex which is in the vicinity of a junction between said first and second interior surfaces.

2. The arrangement of claim 1 wherein said acute angle is within a range of between 5 and 10 degrees.

3. The arrangement of claim 1 or 2, wherein said impact edge height corresponds to one-quarter of the diameter of the coil springs.

4. The arrangement of claim 1 wherein said discharge tube means are formed of a plastic material.

5. The arrangement of claim 1 wherein there is further provided bath means in said cassette means for washing the springs.

* * * * *